(12) United States Patent
Sakoh et al.

(10) Patent No.: US 6,229,280 B1
(45) Date of Patent: May 8, 2001

(54) POWER TOOL CHARGING SYSTEM HAVING A CHARGE LEVEL INDICATOR AND CHARGE CONTROL FUNCTIONS

(75) Inventors: Masahiko Sakoh, Nishikamo-gun; Masatoshi Sugiura, Anjo; Yutaka Matsunaga, Yokkaichi; Tomoo Muramatsu, Nisshin; Kazuyoshi Horikawa, Tenryu, all of (JP)

(73) Assignees: Makita Corporation, Anjo; Honda Giken Kogyo Kabushiki Kaisha, Tokyo, both of (JP)

( * ) Notice: Subject to any disclaimer, the term of this patent is extended or adjusted under 35 U.S.C. 154(b) by 0 days.

(21) Appl. No.: 09/272,638

(22) Filed: Mar. 18, 1999

(30) Foreign Application Priority Data

Mar. 18, 1998 (JP) .................................. 10-068685

(51) Int. Cl.[7] .................................................. H01M 10/46
(52) U.S. Cl. ............................................ 320/106; 320/114
(58) Field of Search ..................................... 320/106, 127, 320/128, 132, 149, 150, 153, 114, DIG. 21, 110

(56) References Cited

U.S. PATENT DOCUMENTS

| | | | |
|---|---|---|---|
| 5,298,346 | * 3/1994 | Gyenes . | |
| 5,463,305 | 10/1995 | Koenck | 320/21 |
| 5,572,110 | * 11/1996 | Dunstan | 320/106 |
| 5,606,242 | * 2/1997 | Hull et al. | 320/106 |
| 5,608,324 | * 3/1997 | Yoshida | 320/106 X |
| 5,619,117 | * 4/1997 | Koenck | 320/106 |
| 5,654,623 | * 8/1997 | Shiga et al. | 320/106 |
| 5,662,174 | 9/1997 | Vermilyer | 173/13 |
| 5,769,657 | 6/1998 | Kondo et al. | 439/500 |
| 5,872,444 | * 2/1999 | Nagano et al. | 320/106 |
| 5,902,105 | 5/1999 | Uejima | 433/27 |

FOREIGN PATENT DOCUMENTS

| | | |
|---|---|---|
| 195 20 765 | 12/1995 | (DE) . |
| 2 302 202 | 1/1997 | (GB) . |
| 4-281332 | 10/1992 | (JP) . |
| 4-351427 | 12/1992 | (JP) . |
| 4-351428 | 12/1992 | (JP) . |

\* cited by examiner

*Primary Examiner*—Edward H. Tso
(74) *Attorney, Agent, or Firm*—Foley, Hoag & Eliot LLP

(57) ABSTRACT

A charging system includes an electric power tool (2) and a charger (1) having internal rechargeable batteries (6) and a controller (9) for monitoring the charge/discharge level of the batteries (6). The electric power tool (2) additionally includes a pair of charge terminals (13*a*, 14*a*) for carrying current to charge the batteries (6), a temperature terminal (15*a*) for outputting to the charger (1) data on the temperature of the batteries, and a data terminal (16*a*) for outputting to the charger data on the battery charge/discharge level from the controller (9). The charger (1) includes a pair of charge terminals (13*b*, 14*b*), a temperature terminal (15*b*), and a data terminal (16*b*) that are electrically connected to the corresponding tool terminals when the tool (2) is set on the charger for a charge. The charging system indicates the remaining charge level on an indicator unit (4) based on the received data on the battery charge/discharge level and changes the amount of the charging current based on the data on the battery charge/discharge level and the battery temperature data received from the tool (2).

24 Claims, 7 Drawing Sheets

POWER TOOL CHARGING SYSTEM HAVING A CHARGE LEVEL INDICATOR AND CHARGE CONTROL FUNCTIONS

This application claims priority to Japanese Patent Application No. 10-68685, the contents of which are incorporated herein by reference.

BACKGROUND OF THE INVENTION

1. Field of the Invention

The present invention relates to battery-charging systems for electrical equipment. More particularly, the present invention relates to a battery-charging system that includes an electric power tool operating on rechargeable internal batteries and a battery charger for charging the internal batteries of the electric power tool.

2. Description of the Related Art

One type of conventional rechargeable electric power tool incorporates a detachable battery pack mounted in the lower end of the handle thereof. When the battery pack needs to be recharged, it is detached from the handle of the tool and set on a separate charger. After the charging is completed, the battery pack is mounted back in the handle to resume operation. If an electric power tool operating on a detachable battery pack is used for extended periods, for example, on a production or assembly line of an automobile plant, an auxiliary battery pack is set in a charger for recharging. When the pack mounted in the tool is discharged, the operator replaces it with the one recharged by the charger and sets the discharged battery pack on the charger for recharging.

Battery packs used for the above-described purpose are generally designed to maximize their capacity and thus the operating time of the tool. This tends to increase the size and weight of the packs, which in turn places an excessive physical strain on the operators and reduces the operability of the tools and work efficiency. This tendency is particularly pronounced when such large and heavy battery packs are used on assembly lines for an extended period; the operability of the tools may be severely affected so as to significantly reduce the productivity of the plant. In addition, loss of time by replacing discharged battery packs has been a significant factor that reduces work efficiency.

Furthermore, when bolts and screws must be tightened to specific torque, electric power tools of the above-described type often fail to fulfill the task, as the operators cannot ascertain the charge level of the battery packs.

Chargers used for such battery packs continue to supply charging current even after the battery packs are fully charged, therefore placing the batteries or cells in the pack under heavy load and reducing the charge efficiency.

SUMMARY OF THE INVENTION

In view of the above-identified problems, an important object of the present invention is to provide a battery-charging system that improves the work efficiency and the operability of electric power tool included in the system.

Another object of the present invention is to provide a battery-charging system that allows the charge level of the batteries to be externally monitored.

Still another object of the present invention is to provide a battery-charging system that controls charging according to the charge/discharge level of the batteries so as to lessen the load on the batteries.

Yet another object of the present invention is to provide a battery-charging system that can easily measure the temperature of the batteries so as to control charging in accordance with the measured temperature of the batteries, thereby lessening the load on the batteries.

The above objects and other related objects are realized by the invention, which provides a power tool charging system including an electric power tool and a charger on which the tool is set for charging. The electric power tool includes at least one rechargeable battery on which the electric power tool operates, a controller for monitoring charge/discharge level of the at least one battery and for generating data on the charge/discharge level of the at least one battery, and a data transmission terminal for externally providing the data on the charge/discharge level of the at least one battery. The electric power tool is set on the charger for charging the at least one battery. The charger can supply charging current to the at least one battery when the electric power tool is set on the charger.

According to one aspect of the present invention, the charger further includes a data receive terminal which is connected to the data transmission terminal of the electric power tool when the electric power tool is set on the charger. The data receive terminal receives the data on the charge/discharge level of the at least one battery from the controller and changes the amount of the charging current based on the charge/discharge level data.

According to another aspect of the present invention, the charger further includes an indicator for indicating the remaining charge of the at least one battery based on the charge/discharge level data received from the controller.

According to still another aspect of the present invention, the electric power tool further includes a temperature sensor for measuring and generating data on the temperature of the at least one battery and a temperature transmission terminal for externally providing the data on the measured battery temperature.

According to yet another aspect of the present invention, the charger further includes a temperature receive terminal which is connected to the temperature transmission terminal when the electric power tool is set on the charger. The charger is adapted to read the battery temperature and change the amount of the charging current based on the battery temperature.

In accordance with another aspect of the present invention, the amount of the charging current is changed to zero amperes.

In one practice, the charger increases the amperage of the charging current to the level prior to the decrease to zero amperes once the temperature of the at least one batteries decreases to a predetermined level.

In another practice, the electric power tool is determined to have been set on the charger for charging when the charger can read the battery temperature by receiving data on the battery temperature at the temperature receive terminal.

To carry out the invention in one preferred mode, the charger further includes a pair of first charge terminals for supplying the charging current to the at least one battery and the electric power tool further includes a pair of second charge terminals that are connected to the at least one battery and that establish contact with the first charge terminals when the electric power tool is set on the charger. In addition, when the voltage between the second charge terminals exceeds a predetermined first threshold, the at least one battery is determined to be fully charged. In this case, the charging current is shut off. When the voltage between the second charge terminals is no higher than a predetermined second threshold, the at least one battery is judged defective, thus also shutting off the charging current.

In one practice, the terminals of the electric power tool are provided thereon in proximity to one another, and the terminals of the charger are provided thereon in proximity to one another so as to establish electrical contact with the corresponding terminals of the electric power tool when the tool is set on the charger for charging the at least one battery.

Other general and more specific objects of the invention will in part be obvious and will in part be evident from the drawing and description which follow.

BRIEF DESCRIPTION OF THE DRAWINGS

For a fuller understanding of the nature and objects of the present invention, reference should be made to the following detailed description and the accompanying drawings, in which.

DETAILED DESCRIPTION OF THE PREFERRED EMBODIMENT

A preferred embodiment according to the present invention will be described hereinafter with reference to the attached drawings.

Figure 1:
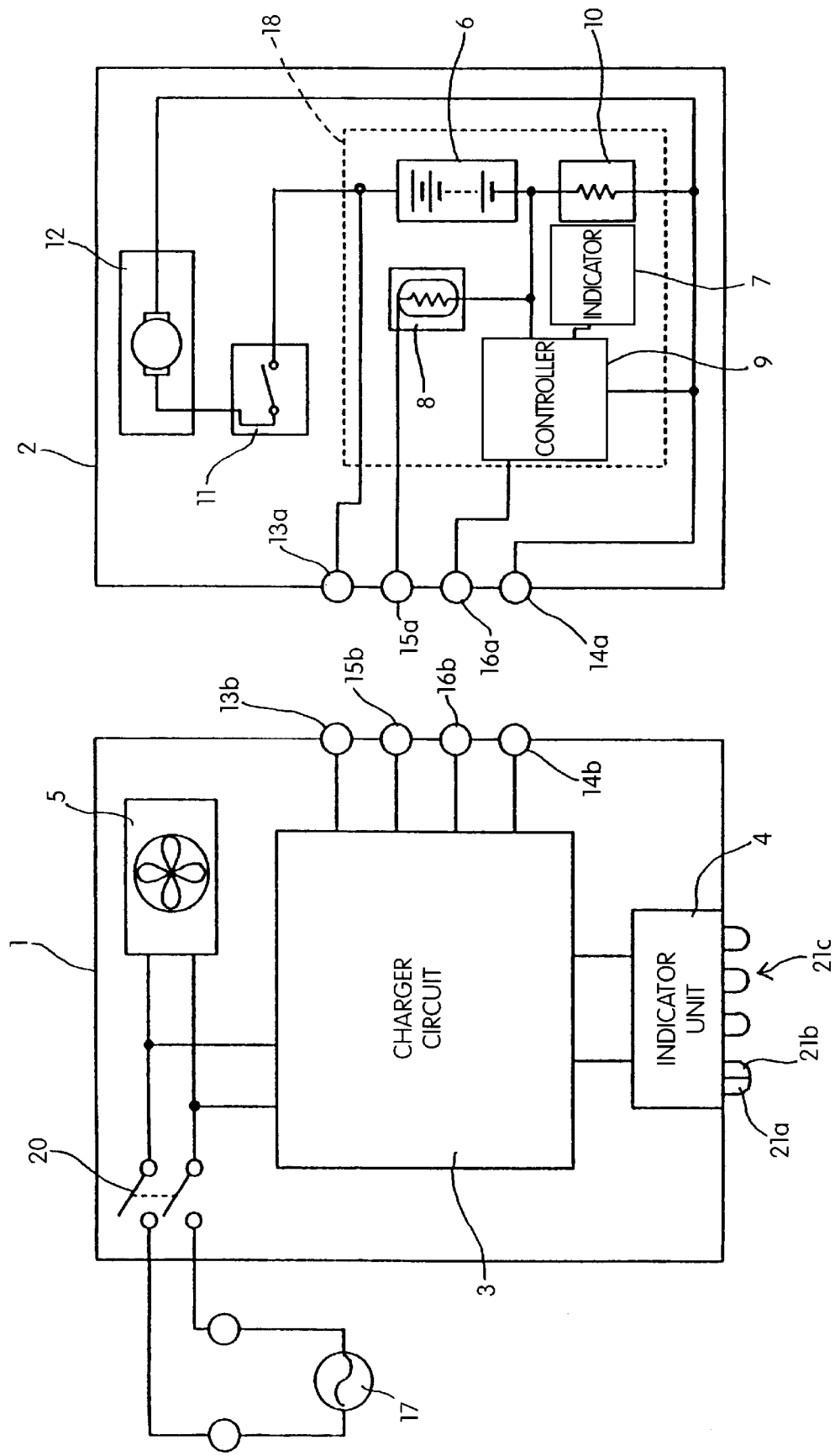
FIG. 1 is a schematic block diagram of an electric power tool charging system in accordance with the present invention.

FIG. 1 is a schematic block diagram of an electric power tool charging system in accordance with the present invention. The charging system includes a charger 1 and an electric power tool 2 including a plurality of rechargeable batteries 6. The charger 1 includes a charger circuit 3, an indicator unit 4, and a cooling fan 5. The charger 1 further includes four terminals that are connected to corresponding terminals of the electric power tool 2 when it is set on the charger 1. These terminals include a pair of terminals 13b and 14b for passing charging current to the electric power tool 2. Another is a data receive terminal 16b for receiving data on the charge/discharge level of the rechargeable batteries 6, and the remaining temperature terminal 15b is provided for receiving data on the temperature of the rechargeable batteries 6.

The charger circuit 3 includes a power supply unit having a transformer and a rectifier circuit. Also included in the charger circuit 3 is a control unit having a central processing unit (CPU) for controlling charging current and operating the indicator unit 4 upon receiving the battery charge/discharge level data and the battery temperature data from the electric power tool 2. More particularly, the charger circuit 3 is capable of changing the amount of charging current according to stored thresholds of remaining battery charge and battery temperature and of driving the indicator unit 4 according to the charge level of the batteries 6.

In this embodiment, the indicator unit 4 includes five light-emitting diodes (LEDs), using a red LED 21a and with a green LED 21b to indicate the operating state of the charger circuit 3, and three yellow LEDs 21c to indicate the charge/discharge level of the batteries 6.

The electric power tool 2 includes a battery unit 18 containing the rechargeable batteries 6 (a plurality of nickel-cadmium (NiCad) batteries in series), a motor 12 powered from the rechargeable batteries 6, a current detector 10 for detecting the amperage of the charging and discharging currents of the batteries 6, and a temperature sensor 8 for sensing the temperature of the batteries 6. The electric power tool 2 additionally includes a controller 9 for computing the charge/discharge level of the batteries 6 based on the detected amperage of the charge and discharging currents and an indicator 7 for receiving data on the charge/discharge level from the controller 9 and prompting the operator to recharge the batteries. Also provided in the tool 2 are four terminals 13a, 14a, 15a, and 16a corresponding to the four terminals of the charger 1. The terminals 13a and 14a are provided for carrying current to charge the batteries 6, the terminal 15a is provided for outputting to the charger 1 data on the temperature of the batteries 6, and the terminal 16a is provided for outputting to the charger 1 the data on the charge/discharge level from the controller 9.

The controller 9 also includes a central processing unit (CPU) which receives the data on the amperage of the batteries' discharging current from the current detector 10 and computing the discharge level of the batteries 6 while the electric power tool 2 is in use. The CPU receives the data on the amperage of the batteries' charging current from the current detector 10 and computes the charge level of the batteries 6 while the batteries are recharged. In this manner, the controller 9 continuously monitors the remaining battery level.

The temperature sensor 8 may be a thermistor whose electrical resistance, which corresponds to the temperature of the batteries 6, can be converted to a voltage so as to measure the temperature of the batteries 6. For the current detector 10, a resistor can be used to convert the amperage of the charge/discharging current to a voltage which is then transmitted to the controller 9. Reference numeral 17, 20, and 11 indicate utility power, a power switch, and a switch for activating the motor 12, respectively.

According to this embodiment, the internal batteries 6 can be charged simply by setting the electric power tool 2 on the charger 1, without removing the batteries each time they become discharged. Therefore, whenever the electric power tool 2 is not in use, the tool can be set on the charger 1 to keep the batteries 6 charged. This allows the size and the weight of the batteries to be reduced so as to lessen the physical strain on the operator and increase the operability and the work efficiency of the tool 2.

Figure 2:
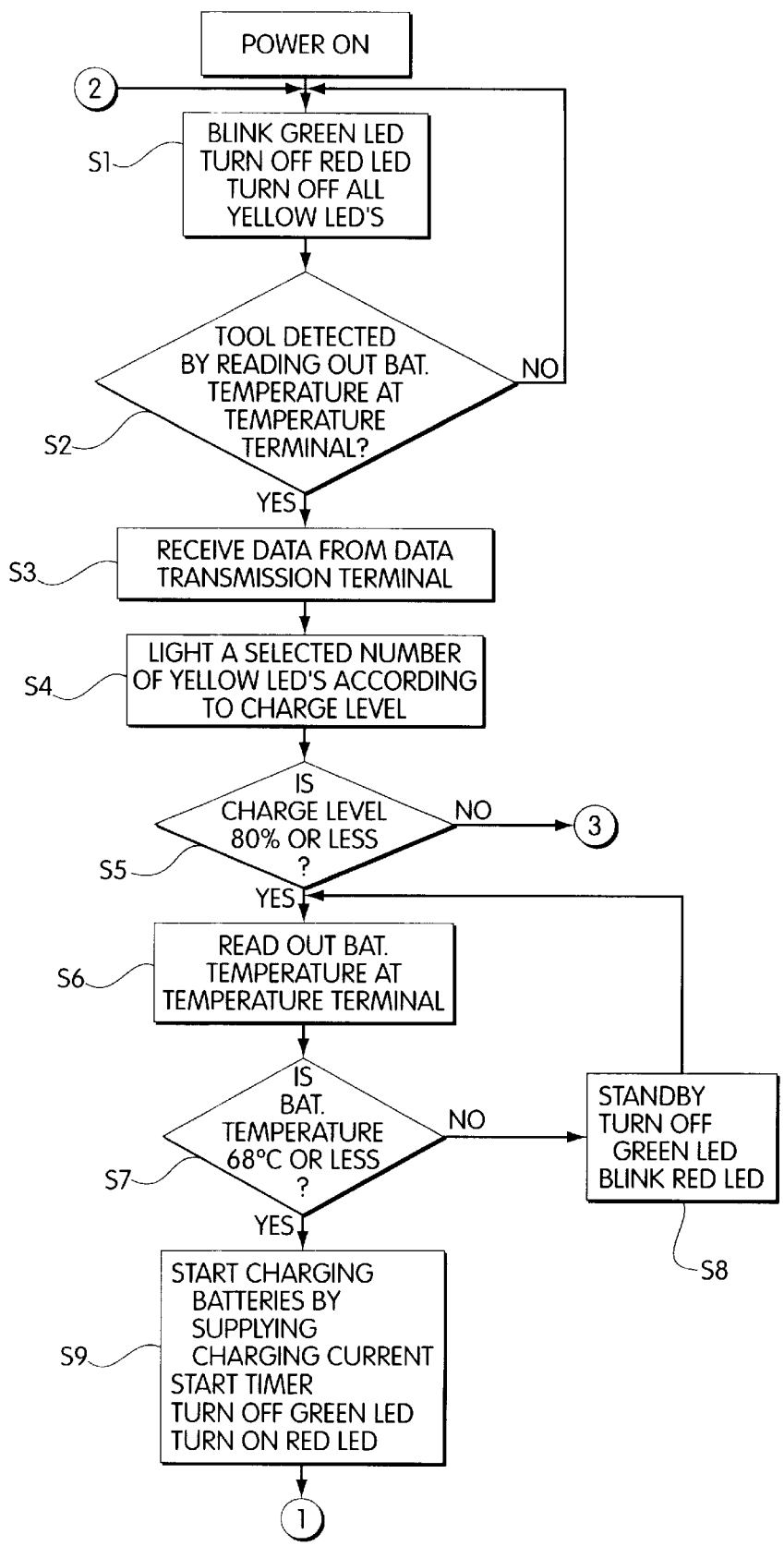
FIGS. 2 and 3, taken together, form a flowchart describing the process of charging performed by the charging system shown in FIG. 1.
Figure 3:
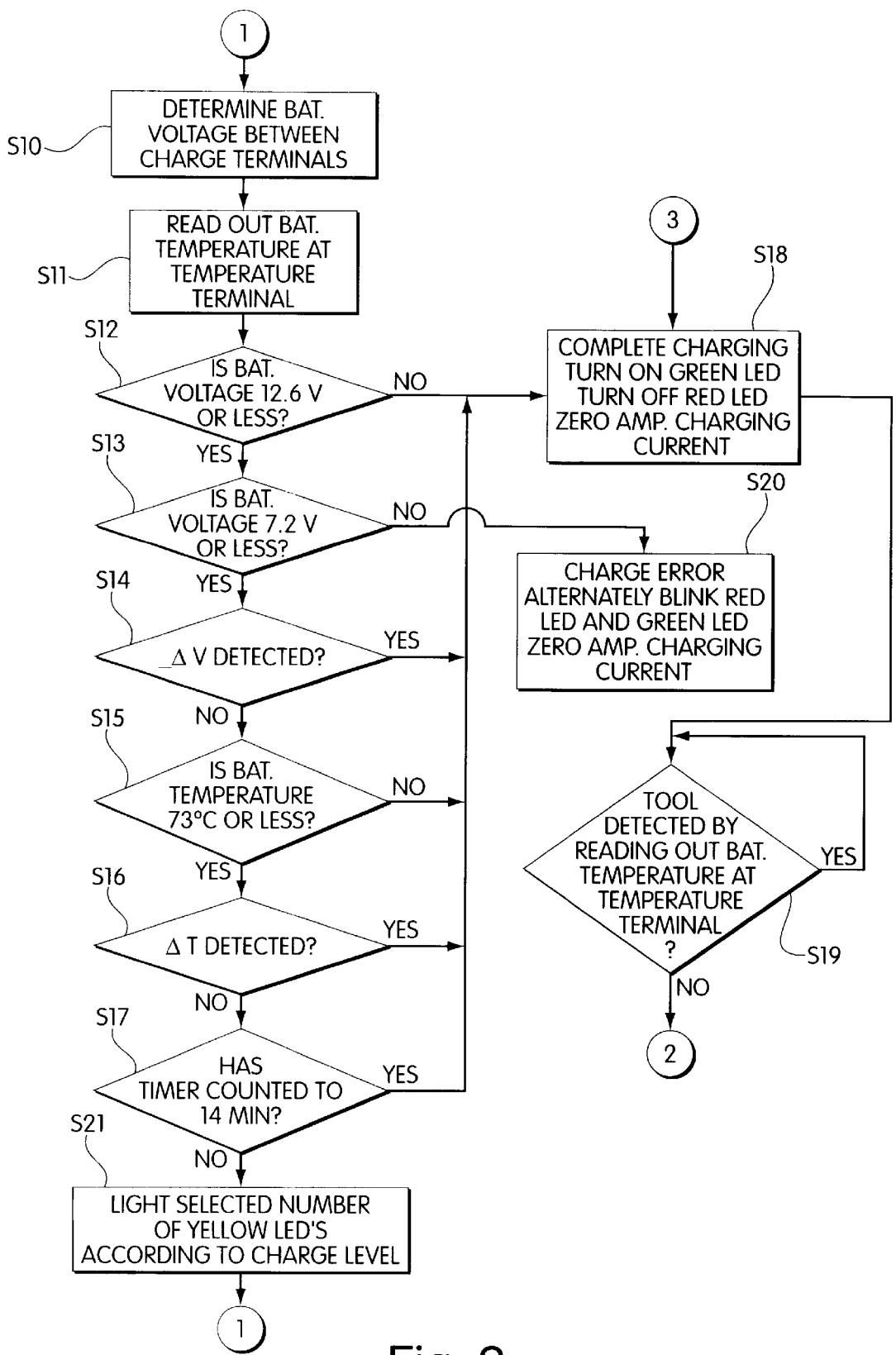

FIGS. 2 and 3, taken together, form a flowchart describing the process of charging performed by the charging system shown in FIG. 1. The process described in the flowchart starts when the power switch 20 of the charger 1 is turned on and ends when the electric power tool 2 is removed from the charger 1.

In this embodiment, the rechargeable batteries 6 are six NiCad batteries placed in series having a combined capacity of 1 ampere-hour (Ah).

When power is supplied to the charger 1 by turning on the power switch 20 of the charger 1, the process goes to step 1, at which point the green LED 21b of the indicator unit 4 blinks while the red LED 21a and the yellow LEDs 21 remain off. This indicator condition continues until it is determined at the following step 2 that the battery temperature is read out from the temperature terminal 15a, indicating that the electric power tool 2 is set on the charger 2.

If it is determined at step 2 that the electric power tool 2 is set in place on the charger 2, the process proceeds to step 3, at which the data receive terminal 16b receives the data on the charge/discharge level. At the next step 4, the charger circuit 3 indicates the remaining battery level by lighting up a selected number of the three yellow LEDs 21 according to the data. In this embodiment, if the batteries 6 are charged to less than 30% of their full capacity, none of the yellow LEDs 21 is lit. If the batteries 6 are charged between 30% and less than 50%, one LED is lit, and if they are charged between 50% and less than 80%, two yellow LEDs 21 are lit. If they are charged to no less than 80% of full charge, all the three are lit.

After the yellow LEDs 21, the number of which is determined in step 4, are lit, the process goes on to step 5, where it is determined whether the batteries 6 are charged to no more than 80% (0.8 Ah) of full charge. If NO, the process goes to step 18, where charging is aborted. If YES, that is, if the batteries 6 are charged to 80% or less, the process goes on to step 6, at which point the battery temperature is determined based on the temperature data provided at the temperature terminal 15a. At step 7, it is determined if the battery temperature is no higher than 68° C. (68 degrees Celsius). If it is determined YES, the process proceeds to step 9. If NO, the red LED 21a starts blinking, and the green LED 21b remains unlit, and no charging current is passed to the batteries 6, so as to suspend charging until the temperature falls below 68 degrees Celsius (step 8).

The batteries 6 are not charged if they are charged to more than 80% of full charge. Therefore, they are not charged every time the tool 2 is set on the charger. This lessens the load on the batteries 6 and thus prolongs the battery service life. Moreover, the suspension of charge until the battery temperature drops below 68 degrees Celsius further lessens the load on the batteries 6, and prolongs the battery service life, and stabilizes the characteristics of the batteries 6. This ultimately reduces the number of times batteries are replaced and the cost of maintenance.

At step 9, charging is started by the passage of charging current to the batteries 6. Regarding the status of the indicator unit 4, the green LED 21b of the indicator unit 4 is turned off, the red LED 21a is lit to indicate the batteries 6 are being charged and a timer (not shown) is started to count the charge time. When the process reaches step 10, the voltage between the charge terminals 13a and 14a, i.e., the battery voltage, is measured. At step 11, the battery temperature is determined based on the temperature data provided at the temperature terminal 15a. At the following step 12, it is determined whether or not the measured battery voltage is no more than 12.6 V. If so, the process goes on to step 13. If the voltage exceeds the value, the process goes to step 18, where the charging is terminated.

At step 13, it is determined whether or not the measured battery voltage is 7.2 V or higher. If so, the process goes on to step 14. If not, the process goes on to step 20, where the charging is stopped. Additionally some form of error indication, such as alternate blinking of the red LED 21a and the green LED 21b, is made to prompt the operator to replace the batteries or take another appropriate action.

At step 14, based on voltage measurements that have been made, it is determined whether or not the battery voltage is decreasing. If YES, that is, any decrease is detected, the batteries 6 are determined to be fully charged, and the process goes on to step 18, where the charging is terminated. If NO, the process goes on to step 15. At this step, it is determined if the measured temperature is no higher than 73 degrees Celsius. If so, the process proceeds to step 16. If the temperature is higher than the threshold, the batteries are determined to be fully charged, and the process goes on to step 18 to terminate the charging.

At step 16, the rate of temperature rise of the batteries 6 is computed based on the temperature measurements that have been made. If no rapid rise is detected, the process proceeds to step 17. If a rapid temperature rise is detected, the batteries are determined to be fully charged and the process goes on to step 18 to terminate the charging.

At step 17, whether or not a charging time of 14 minutes has elapsed is determined. If this query produces an affirmative indication, the process goes to step 18 to terminate the charging. If this query produces a negative indication, the process goes on to step 21, at which point a selected number of the three yellow LEDs 21 of the indicator unit 4 are lit up according to the data provided by the controller 9 on the charge level (remaining battery charge). In this embodiment, as the batteries 6 are designed to be fully charged in no longer than 14 minutes and because any charging over that time limit should not be required, the maximum charge time is set to 14 minutes.

At step 18, the charging is terminated by reducing the charging current to 0 (zero) amperes, with the green LED 21b lit and the red LED 21a off. At the subsequent step 19, it is determined whether or not the electric power tool 2 remains set on the charger 1. If so, the conditions of step 18 are maintained. If the electric power tool 2 is removed from the charger 1, the process goes back to step 1 to resume the foregoing processing.

As can be seen from the foregoing description, according to the present invention, charging is suspended depending on the temperature of the batteries 6, and full charge is determined based on the temperature, voltage, and the change in these values, in which case charging is interrupted. This lessens the load on the batteries, positively detects a full charge, and prevents overcharging, thus maximizing the battery life.

Furthermore, the data on charge/discharge level and on battery temperature output at the corresponding tool terminals not only can be used by the charger 1 for the above-described purposes, but also used by the operator to maintain the torque of the tool within a preferred range and to monitor the charge level.

Since the charger of this embodiment indicates both operating state and the remaining battery charge, the operator can anticipate when the charging of the batteries 6 is completed, allowing the operator to use the electric power tool efficiently. Such information can be particularly helpful in using the tools efficiently when more than one tool are used.

The temperature and voltage thresholds used in the flowchart are subject to modification depending on the type and configuration of the batteries.

Figure 4:
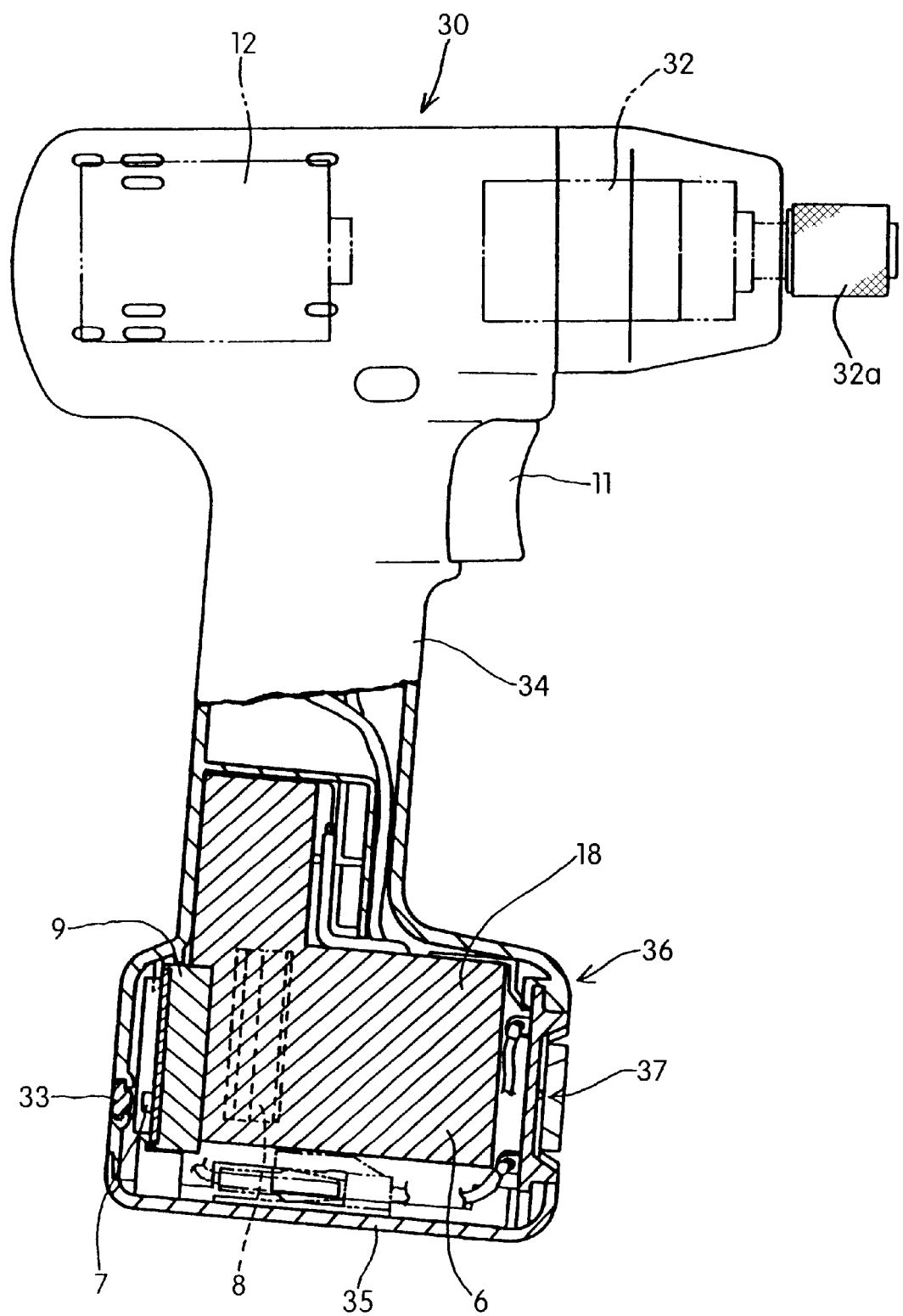
FIG. 4 is a partially cutaway side elevation of a rechargeable impact screwdriver to which the upper half of the schematic block diagram of FIG. 1 is applied.
Figure 5:
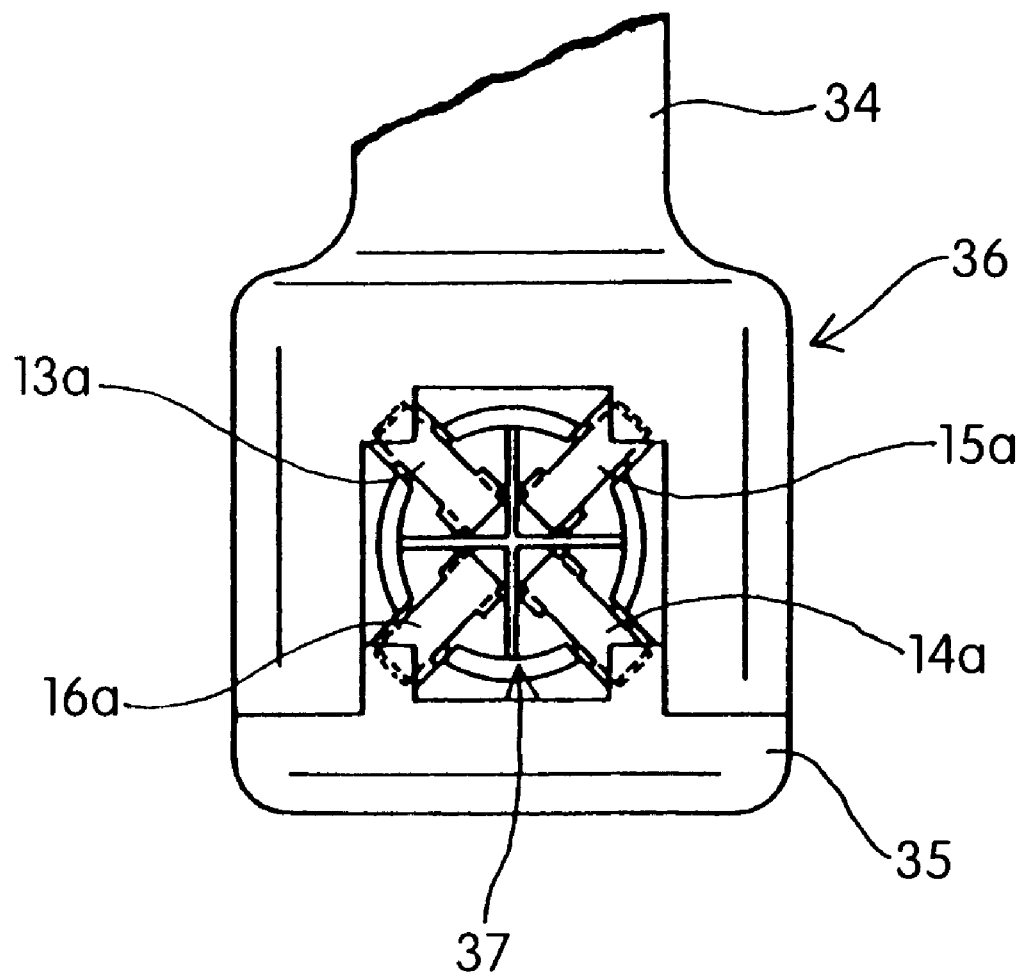
FIG. 5 is a front view of a protrusion formed in a grip handle of the impact screwdriver shown in FIG. 4.
Figure 6:
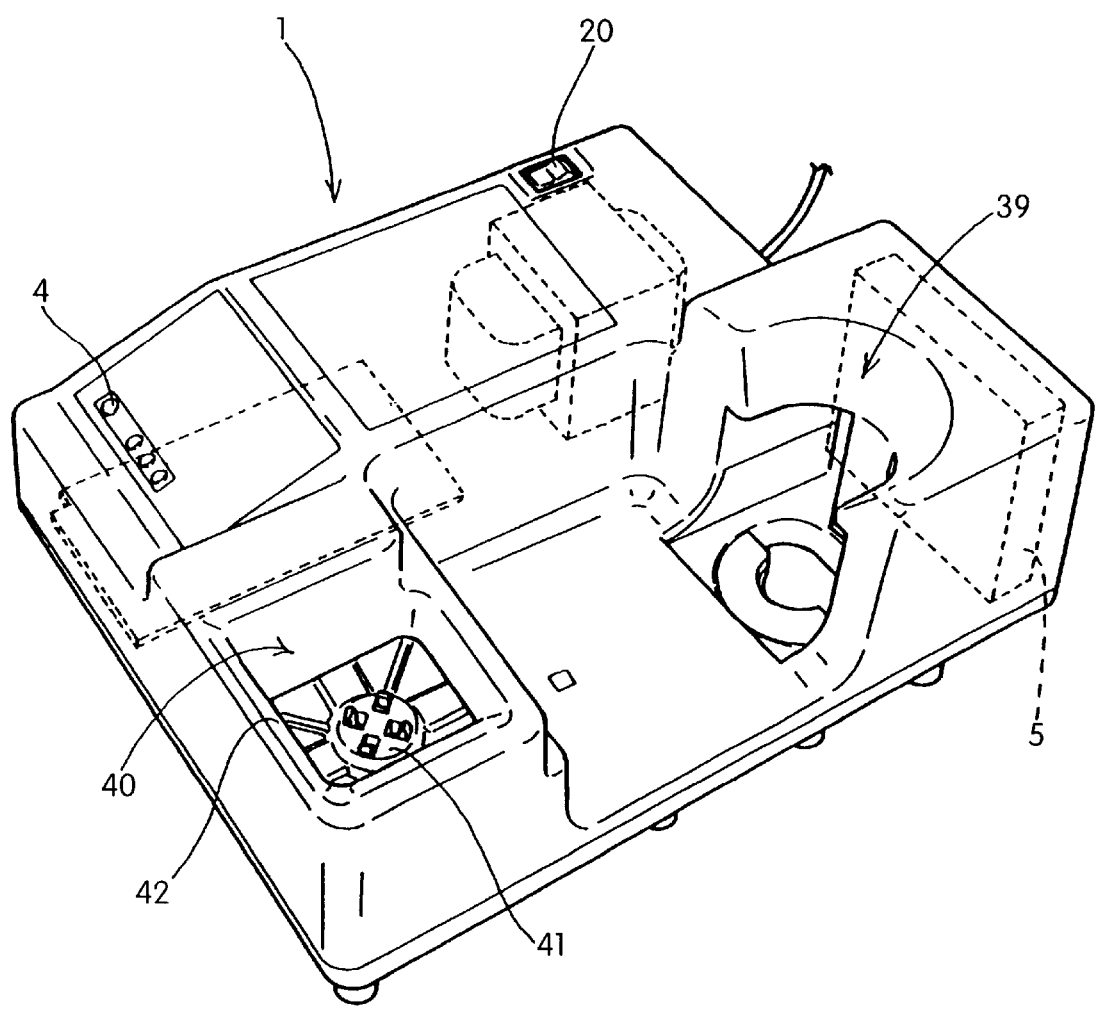
FIG. 6 is a perspective view of a charger to which the lower half of the schematic block diagram of FIG. 1 is applied.

FIGS. 4–6 show the charging system of FIG. 1 as applied to an impact screwdriver 30 and its charger. Similar or identical reference numerals in FIGS. 1 and 4–6 designate identical or corresponding parts and elements.

FIG. 4 is a partially cutaway side elevation of the impact screwdriver 30 to which the upper half of the schematic block diagram of FIG. 1 is applied.

The impact screwdriver 30 includes a motor 12 interlocked with a hydraulic unit 32 by means of a reducer (not shown). The hydraulic unit 32 is coupled to a nose or chuck (driven unit) 32a to which a tool bit (not shown) is attached. During operation, the torque produced by the motor 12 is transmitted to the tool bit by means of the reducer, the hydraulic unit 32, and the nose 32a. The hydraulic unit 32 allows the transmitted torque to vary in response to the load applied to the tool bit so as to tighten screws and bolts. The impact screwdriver 30 additionally includes a grip handle 34 and the battery unit 18 in the lower portion of the grip handle 34. The batteries 6 can be removed from the impact screwdriver 30 by removing a cover 35 provided at the bottom surface of the grip handle 34. In addition, the bottom portion of the grip handle 34 includes a protrusion 36 which is located on the same side of the handle 34 as the nose 32a and which extends approximately parallel to the nose 32a of the impact screwdriver 30. A recess 37 formed in the protrusion 36 houses the terminals 13a, 14a , 15a, and 16a mounted on the inner surface thereof so as to establish electrical contact with the corresponding terminals of the charger 1. In addition, a light-emitting diode (LED) 7 is provided on the controller to indicate to the operator the charge level of the batteries through a lens 33 mounted in the grip handle 34.

FIG. 5 is a front view of the protrusion formed in a grip handle of the impact screwdriver 30. As illustrated, the charge terminals 13a and 14a, the temperature terminal 15a, and the data transmission terminal 16a are disposed radially from the center of the bottom of the recess 37 in close proximity to one another, dividing the inner surface of the recess into four equal sections.

Referring to FIG. 6, the charger 1 is formed with a first receiving recess 39 for accommodating the nose 32a and the second receiving recess 40 for accommodating the protrusion 36 of the handle grip 34. Accordingly, the impact screwdriver 30 can be set for a charge by placing it on the charger 1 with the nose 32a oriented downward. Formed on the bottom surface of the second receiving recess 40 is a circular protrusion 41 exposing the four terminals of the charger 1.

The first receiving recess 39 has an opening at the bottom thereof so that the impact screwdriver 30 can be set on the charger 1 without removing the tool bit. A cooling fan 5 is installed in proximity to the first receiving recess 39 so as to cool the nose 32a. The second receiving recess 40 is rimmed with tapering guide slopes 42 for positioning the impact screwdriver 30 to establish secure electrical contact of the terminals in the circular protrusion 41 with the terminals of the screwdriver 30 when it is set on the charger 1. The second receiving recess 40 also prevents the impact screwdriver 30 from being displaced once the impact screwdriver 30 is set for a battery charge.

Figure 7:
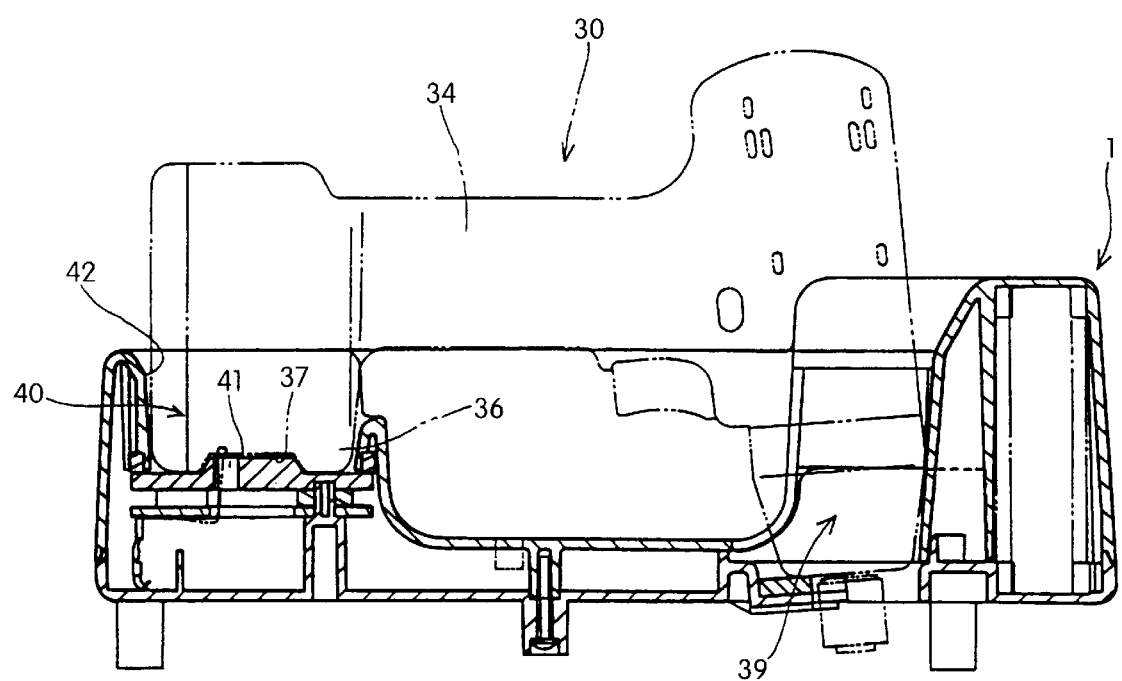
FIG. 7 is a lengthwise cross section of the charger of FIG. 6 with the impact screwdriver (shown in two-dot chain lines) set thereon for recharging.

FIG. 7 is a lengthwise cross section of the charger 1 with the impact screwdriver (shown in two-dot chain lines) set thereon for recharging. As illustrated, the nose 32a is supported in the first receiving recess 39 while the protrusion 36 on the handle grip 34 is supported in the second receiving recess 40. As both ends of the tool 30 are supported simply by setting the tool on the charger 1, secure contact is established between the terminals of the charger 1 and those of the tool 2.

In the foregoing embodiment, determination of whether the batteries are judged fully charged is based on the voltage and the temperature of the batteries. However, the same judgement can be made based on the charge/discharge level data from the controller of the tool. Unlike in the foregoing embodiment, charging current may be changed in different rates in a plurality of steps. In this way, the batteries can be charged more rapidly by supplying a larger charging current when the battery charge level is low.

The remaining charge of the batteries can be indicated in a number of manners without departing from the scope of the invention. For example, different numbers of LED lamps may be caused to flash to represent different charge levels. Furthermore, seven-segment LEDs or LEDs with variable colors can be used to serve the same purpose.

Among other advantages, the charging system of the present invention allows the charger and/or the operator to stop charging when the batteries are charged to a certain level, since charging is carried out according to the battery charge/discharge level data. This prolongs the battery service life.

The present invention allows the operator to monitor the remaining charge level of the batteries and to anticipate when the batteries will be discharged. It is also possible to estimate when they will be fully charged if they are charged immediately after they are discharged.

According to the present invention, the battery temperature is monitored and utilized to maintain the batteries in good condition. More particularly, utilization of the battery temperature data or on the battery temperature change data to perform charging provides greater protection from overcharging and/or damage to batteries. Termination of charging current upon detection of abnormal temperature provides further protection of batteries and prevents waste of electricity.

It will thus be seen that the present invention efficiently attains the object set forth above, among those made apparent from the preceding description. As other elements may be modified, altered, and changed without departing from the scope or spirit of the essential characteristics of the present invention, it is to be understood that the above embodiments are only an illustration and not restrictive in any sense. The scope or spirit of the present invention is limited only by the terms of the appended claims.

What is claimed is:

1. A power tool charging system, comprising:
an electric power tool including,
at least one rechargeable battery on which the electric power tool operates,
a controller for monitoring charge/discharge level of the at least one battery and for generating data on the charge/discharge level of the at least one battery and
a data transmission terminal for externally providing the data on the charge/discharge level of the at least one battery; and
a charger on which the electric power tool is set for charging the at least one battery, the charger supplying charging current to the at least one battery when the electric power tool is set on the charger.

2. A charging system in accordance with claim 1, wherein the charger further includes a data receive terminal which is connected to the data transmission terminal of the electric power tool when the electric power tool is set on the charger, the data receive terminal receiving the data on the charge/discharge level of the at least one battery from the controller and changing the amount of the charging current based on the charge/discharge level data.

3. A charging system in accordance with claim 2, wherein the charger further includes an indicator means for indicating the remaining charge of the at least one battery based on the charge/discharge level data received from the controller.

4. A charging system in accordance with claim 1, wherein the electric power tool further includes a temperature sensor for measuring and generating data on the temperature of the at least one battery, and a temperature transmission terminal for externally providing the data on the measured battery temperature.

5. A charging system in accordance with claim 4, wherein the charger further includes a temperature receive terminal which is connected to the temperature transmission terminal when the electric power tool is set on the charger, the charger having means for reading the battery temperature and changing the amount of the charging current based on the battery temperature.

6. A charging system in accordance with claim 5, wherein the amount of the charging current supplied by said charger is changed to zero amperes.

7. A charging system in accordance with claim 2, wherein the amount of the charging current supplied by said charger is changed to zero amperes.

8. A charging system in accordance with claim 3, wherein the amount of the charging current supplied by said charger is changed to zero amperes.

9. A charging system in accordance with claim 6, wherein the charger is adapted to increase the amperage of the charging current to the level prior to the decrease to zero amperes once the temperature of the battery decreases to a predetermined level.

10. A charging system in accordance with claim 6, further comprising means for determining the electric power tool is disposed on the charger for charging when the charger reads the battery temperature by receiving data on the battery temperature at the temperature receive terminal.

11. A charging system in accordance with claim 6, wherein the charger further includes a pair of first charge terminals for supplying the charging current to the at least one battery and the electric power tool further includes a pair of second charge terminals that are connected to the at least one battery and that establish contact with the first charge terminals when the electric power tool is set on the charger, and further wherein the at least one battery is determined to be fully charged when the voltage between the second charge terminals exceeds a predetermined first threshold, thus shutting off the charging current, and the at least one battery is defective when the voltage between the second charge terminals is no higher than a predetermined second threshold, thus shutting off the charging current.

12. A charging system in accordance with claim 11, wherein the terminals of the electric power tool are provided thereon in proximity to one another, and the terminals of the charger are provided thereon in proximity to one another so as to establish electrical contact with the corresponding terminals of the electric power tool when the tool is set on the charger for charging the at least one battery.

13. A charging system in accordance with claim 2, wherein the electric power tool further comprises a temperature sensor for measuring and generating data on the temperature of the battery, and a temperature transmission terminal for externally providing the data on the battery temperature.

14. A charging system in accordance with claim 3, wherein the electric power tool further comprises a temperature sensor for measuring and generating data on the temperature of the battery, and a temperature transmission terminal for externally providing the data on the battery temperature.

15. A charging system in accordance with claim 7, wherein the charger is adapted to increase the amperage of the charging current to the level prior to the decrease to zero amperes once the temperature of the battery decreases to a predetermined level.

16. A charging system in accordance with claim 8, wherein the charger is adapted to increase the amperage of the charging current to the level prior to the decrease to zero amperes once the temperature of the battery decreases to a predetermined level.

17. A power tool charging system, comprising
a power tool including,
    at least one rechargeable battery housed within the power tool for supplying power to said power tool,
    a controller for monitoring a condition of said at least one battery and for generating data based on said condition of said at least one battery, and
    a data transmission terminal for externally providing the data on said condition of said at least one battery; and
an external charger housed separately from said power tool and upon which said power tool is set for charging the at least one battery, the external charger supplying charging current to the at least one battery when the power tool is set on the charger.

18. The charging system of claim 17, wherein said condition monitored by said controller is the charge/discharge level of said at least one battery.

19. The charging system of claim 17, where said condition monitored by said controller is the temperature of said at least one battery.

20. The charging system of claim 17, wherein the external charger includes a data receive terminal for connecting to the data transmission terminal of said power tool.

21. The charging system of claim 20, wherein the external charger includes a receiving recess within which said data receive terminal is positioned, said receiving recess being sized and shaped to receive a portion of said power tool having said data transmission terminal.

22. A power tool charging system, comprising
an electric power tool including,
    at least one rechargeable battery on which the electric power tool operates,
    a controller for monitoring charge/discharge level of the at least one battery and for generating data on the charge/discharge level of the at least one battery,
    a data transmission terminal for externally providing the data on the charge/discharge level of the at least one battery,
    a temperature sensor for measuring and generating data on the temperature of the at least one battery, and
    a temperature transmission terminal for externally providing the data on the measured battery temperature; and
a charger upon which the electric power tool is set for charging the at least one battery, the charger supplying charging current to the at least one battery when the electric power tool is set on the charger, the charger including,
    a data receive terminal which is connected to the data transmission terminal of the electric power tool when the electric power tool is set on the charger, the data receive terminal receiving the data on the charge/discharge level of the at least one battery from the controller, the charger operating to change the amount of charging current based on the charge/discharge level data, and a temperature receive terminal which is connected to the temperature transmission terminal of the electric power tool when the electric power tool is set on the charger, the temperature receive terminal receiving the measured battery temperature from the temperature sensor, the charger operating to change the charging current based on the measured battery temperature.

23. A charging system in accordance with claim 22, wherein the amount of charging current is changed to zero amperes in response to the charge/discharge level data.

24. A charging system in accordance with claim 22, wherein the amount of charging current is changed to zero amperes in response to the measured battery temperature.

* * * * *

UNITED STATES PATENT AND TRADEMARK OFFICE
CERTIFICATE OF CORRECTION

PATENT NO.   : 6,229,280 B1
DATED        : May 8, 2001
INVENTOR(S)  : Sakoh et al.

It is certified that error appears in the above-identified patent and that said Letters Patent is hereby corrected as shown below:

Column 1,
Line 58, replace "tool" with -- tools --

Column 5,
Line 29, replace "C." with -- C --
Line 62, replace "Additionally" with -- Additionally, --

Column 6,
Line 57, replace "used,." with -- used --

Column 8,
Line 48, replace "battery" with -- battery, --

Column 9,
Line 4, replace "battery," with -- battery --

Column 10,
Line 21, replace "towel" with -- tool --

Signed and Sealed this

Eleventh Day of March, 2003

JAMES E. ROGAN
*Director of the United States Patent and Trademark Office*